United States Patent
Fukushi et al.

(10) Patent No.: US 7,224,192 B2
(45) Date of Patent: May 29, 2007

(54) VOLTAGE DETECTION CIRCUIT

(75) Inventors: Iwao Fukushi, Gunma-ken (JP); Noriaki Okada, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/251,263

(22) Filed: Oct. 14, 2005

(65) Prior Publication Data

US 2006/0082395 A1  Apr. 20, 2006

(30) Foreign Application Priority Data

Oct. 14, 2004  (JP)  ............................. 2004-300138

(51) Int. Cl.
 *H03K 5/22*  (2006.01)
(52) U.S. Cl. ........................... 327/77; 327/143; 327/81
(58) Field of Classification Search ................ 327/143, 327/77, 78, 80, 81
See application file for complete search history.

(56) References Cited

U.S. PATENT DOCUMENTS 6,472,912 B1 * 10/2002 Chiu et al. .................. 327/143
2003/0227306 A1 * 12/2003 Di Iorio ...................... 327/143

FOREIGN PATENT DOCUMENTS

JP  2002-296306  10/2002

* cited by examiner

*Primary Examiner*—Long Nguyen
(74) *Attorney, Agent, or Firm*—SoCal IP Law Group LLP; Steven C. Sereboff; John E. Gunther

(57) ABSTRACT

A voltage detection circuit, comprises a constant-current circuit, a current mirror circuit operated by the constant-current circuit, at least one diode-connected first transistor disposed between an output of the current mirror circuit and a detected voltage, and an output circuit outputting one logic voltage in response to a turn-on of the first transistor when the detected voltage is a predetermined voltage or higher, and outputting the other logic voltage in response to a turn-off of the first transistor when the detected voltage is lower than the predetermined voltage.

4 Claims, 5 Drawing Sheets

VOLTAGE DETECTION CIRCUIT

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority from Japanese Patent Application No. 2004-300138 filed on Oct. 14, 2004, which is herein incorporated by reference.

BACKGROUND OF THE INVENTION

1. Field of the Invention

The present invention relates to a voltage detection circuit.

2. Description of the Related Art

Conventionally, in an integrated circuit (LSI), a voltage detection circuit is used for monitoring reduction of a power supply voltage, for example.

FIG. 3 is a block diagram showing an example of a configuration for monitoring reduction of a voltage. A logic circuit 100 has a CMOS inverter circuit, for example. A voltage VDD is applied to the logic circuit 100.

A voltage detection circuit 102 detects that the voltage VDD becomes lower than a predetermined voltage. If the voltage VDD becomes lower than a predetermined voltage, a logic operation of the logic circuit 100 is forced to be terminated, for example.

FIG. 4 is a diagram showing an example of a configuration of a CMOS interval circuit provided on the logic circuit 100, for example. The CMOS inverter circuit shown in FIG. 4 is provided with a P-channel type MOSFET (hereinafter, referred to as PMOS) MP and an N-channel type MOSFET (hereinafter, referred to as NMOS) MN connected serially between the voltage VDD and ground. A voltage VIN is applied to gates of the PMOS MP and the NMOS NM, and a voltage VOUT is output from a connection point of the PMOS MP and the NMOS NM.

In the CMOS inverter circuit with the configuration described above, assuming that VT (e.g., 0.85 V) is thresholds of the PMOS MP and the NMOS NM, if the voltage VDD becomes lower than 2*VT (1.7 V), the voltage VOUT may become high impedance.

FIG. 5 is a diagram for describing an operation of the CMOS inverter circuit when the voltage VDD<2*VT. A vertical axis is a voltage value of the voltage VIN. It is assumed that VT is thresholds of both the PMOS MP and the NMOS NM and that the voltage VDD is 1.5*VT.

In this case, when the voltage VIN is in the range of 1.5*VT>the voltage VIN>VT, the NMOS NM is turned on and the PMOS MP is turned off. Therefore, the voltage VOUT becomes "Low (hereinafter, referred to as L)"

When the voltage VIN is in the range of 0.5*VT>the voltage VIN>0, the NMOS NM is turned off and the PMOS MP is turned on. Therefore, the voltage VOUT becomes "High (hereinafter, referred to as H)".

On the other hand, when the voltage VIN is in the range of VT>the voltage VIN>0.5*VT, both the NMOS NM and the PMOS MP are turned off. Therefore, the voltage VOUT becomes "Hi-z (high impedance)" and the operation of the CMOS inverter circuit becomes uncertain.

The voltage reduction of the voltage VDD increases the range of the voltage VIN which makes the voltage VOUT "Hi-z". On the other hand, in the range of the voltage VDD>2*VT, the voltage VOUT does not become "Hi-z" regardless of the value of the voltage VIN.

Therefore, the voltage detection circuit 102 detects that the voltage VDD is reduced to, for example, 2*VT and, for example, terminates the operation of the CMOS inverter circuit if the voltage VDD becomes lower than 2*VT. In FIG. 3, if a plurality of voltages is used as the power supply voltage, a plurality of voltage detection circuits is provided correspondingly to each voltage.

As such a voltage detection circuit 102 detecting voltage reductions, propositions are made for voltage detection circuits which detect voltage reductions by using voltage dividing resistors and reference voltages See, e.g., Japanese Patent Application Laid-Open Publication No. 2002-296306.

FIG. 6 is a circuit diagram showing an example of a configuration of a conventional voltage detection circuit 102.

The voltage detection circuit 102 is provided with PMOS T1, T2, T3, T4 and T5, NMOS T6, T7 and T8, voltage dividing resistors R1 and R2, and a constant-current circuit I.

The voltage detection circuit shown in the figure is assumed to detect that a voltage VDD becomes lower than 2*VT (1.7 V) described above.

A voltage VCC is applied to sources of the PMOS T1, T2 and T3; gates of the PMOS T1, T2 and T3 are mutually connected; and a drain of the diode-connected PMOS T1 is connected to the constant-current circuit I. The diode connection is to short-circuit a gate and a drain in the case of the MOSFET and to short-circuit a base and a collector in the case of a bipolar transistor. Such a diode-connected transistor performs the same operation as a diode element in PN junction.

The PMOS T1, T2 and T3 constitute a current mirror circuit, and if the PMOS T1, T2 and T3 have a transistor size ratio of 1, constant currents flowing through the PMOS T2 and the PMOS T3 are the same level as a current I flowing through the PMOS T1.

A source of the PMOS T4 is connected to a drain of the PMOS T2 and a drain of the PMOS T4 is connected to a drain of the NMOS T6. A voltage applied to a gate of the PMOS T4 is the voltage VDD divided by the resistor R1 and the resistor R2, i.e., the voltage VDD×R2/(R1+R2). R1 and R2 are resistance values of the resistor R1 and the resistor R2, and when assuming that a ratio of R1 to R2 is, for example, 5:12 and if the voltage VDD is 1.7V, a gate voltage of the PMOS T4 is 1.2V.

A source of the PMOS T5 is connected to the drain of the PMOS T2 and a drain of the PMOS T5 is connected to a drain of the NMOS T7. A reference voltage VREF (e.g., 1.2 V) is generated by a reference voltage generation circuit and applied to a gate of the PMOS T5.

Sources of both the NMOS T6 and the NMOS T7 are grounded and the NMOS T6 is a diode-connected current mirror circuit. Therefore, if the NMOS T6 and the NMOS T7 have a transistor size ratio of 1, a constant current flowing through the NMOS T7 is the same level as a drain current of the NMOS T6.

A drain of the NMOS T8 is connected to a drain of the PMOS T3 as well as a detection-result output terminal. A source of the NMOS T8 is grounded. A gate of the NMOS T8 is connected to a drain of the PMOS T5. The NMOS T8 is assumed to have a transistor size ratio greater than the PMOS T3.

Then, descriptions are made for the operation of the voltage detection circuit shown in FIG. 6.

The constant current I is always applied to the drains of the PMOS T1, T2 and T3 constituting a current mirror circuit. Since the sources of the PMOS T4 and the PMOS T5 are connected in common, the sum of the currents applied to the PMOS T4 and the PMOS T5 is I. In other words, a relationship is established as Ia+Ib=I.

If the voltage VDD is larger than 1.7 V, that is, if the gate voltage of the PMOS T4 is larger than the gate voltage of the PMOS T5, a current Ia flowing between the source and drain of the PMOS T4 is smaller than a current Ib flowing between the source and drain of the PMOS T5. Therefore, a current Ib−Ia is supplied to a base of the NMOS T8 and the NMOS T8 is turned on. Since a voltage of detection-result output terminal is reduced, the output of the detection-result output terminal becomes "L".

On the other hand, if the voltage VDD is smaller than 1.7 V, that is, if the gate voltage of the PMOS T4 is larger than the gate voltage of the PMOS T5, the current Ia flowing between the source and drain of the PMOS T4 is larger than the current Ib flowing between the source and drain of the PMOS T5. Also, the NMOS T6 and T7 in the current mirror connection attempt to apply the current Ia between the drain and source. Since the current Ia is larger than the current Ib, a current is not supplied to the gate of the NMOS T8 and the NMOS T8 is turned off. Therefore, since the constant current I is supplied from the PMOS T3 to the detection-result output terminal and the voltage of the detection-result output terminal becomes high, the output of the detection-result output terminal becomes "H".

Therefore, the voltage detection circuit 102 can detect that the power supply voltage VDD becomes lower than 2*VT (1.7V) since the output of the detection-result output terminal changes from "L" to "H".

In this way, the conventional voltage detection circuit detects that the voltage VDD becomes lower than, for example, 2*VT, using the voltage dividing resistor dividing the voltage VDD and the reference voltage VREF from the reference voltage generation circuit.

In order to detect reduction of a voltage VDD, A conventional voltage detection circuit 102 shown in FIG. 6 needs resistors R1 and R2 dividing the voltage VDD and a reference voltage VREF obtained from a reference voltage generation circuit provided outside of the voltage detection circuit 102, besides MOSFET.

Also, when performing the voltage detection, since it is decided whether a voltage is larger or smaller than the reference voltage VREF by applying currents to the voltage dividing resistors R1 and R2, it is problematic that power consumption is increased.

Further, if the reference voltage generation circuit is included and integrated onto the same chip, it is problematic that a chip area is increased.

SUMMARY OF THE INVENTION

It is therefore an object of the present invention to provide a voltage detection circuit enabling detection of voltage reduction with a configuration which has transistors only instead of using resistors and a reference voltage.

In order to achieve the above and other objects, according to an aspect of the present invention there is provided a voltage detection circuit comprises a constant-current circuit, a current mirror circuit operated by the constant-current circuit, at least one diode-connected first transistor disposed between an output of the current mirror circuit and a detected voltage, and an output circuit outputting one logic voltage in response to a turn-on of the first transistor when the detected voltage is a predetermined voltage or higher, and outputting the other logic voltage in response to a turn-off of the first transistor when the detected voltage is lower than the predetermined voltage.

Other features of the present invention will become more apparent from the description of this specification when taken in conjunction with the accompanying drawings.

DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

From the descriptions of the specification and accompanying drawings, at least following subjects become apparent.

===Configuration of Voltage Detection Circuit===

Figure 1:
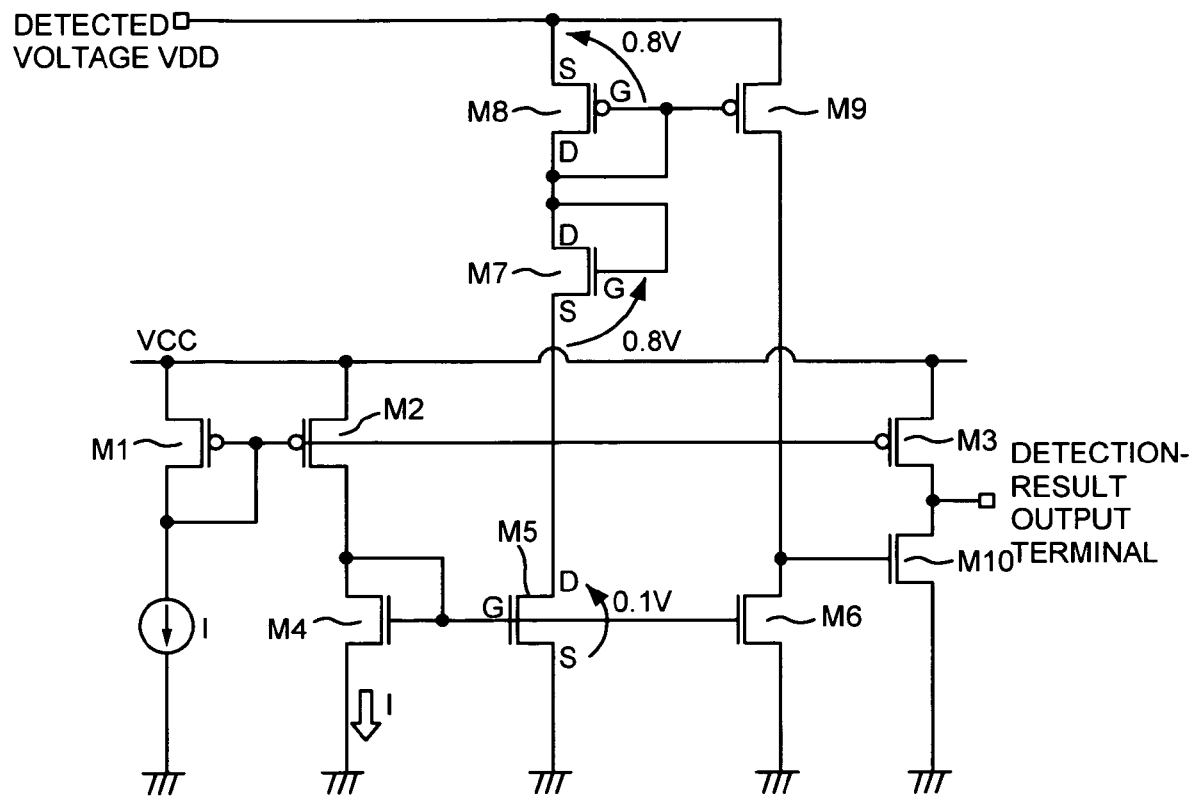
FIG. 1 is a circuit diagram of a voltage detection circuit according to an implementation of the present invention.

FIG. 1 is a circuit diagram showing an example of a configuration of a voltage detection circuit according to an implementation of the present invention.

The voltage detection circuit shown in the figure is a voltage detection circuit detecting that a voltage VDD ("detected voltage") becomes lower than 1.7 V, and is provided with P-channel type MOSFET (hereinafter, referred to as PMOS) M1, M2, M3, M8 and M9, N-channel type MOSFET (hereinafter, referred to as NMOS) M4, M5, M6 and M7 and a constant-current circuit I.

The voltage detection circuit shown in FIG. 1 is integrated with a logic circuit whose power supply voltage is the voltage VDD, on the same chip, for example.

It is assumed that transistor size ratios (W/L) are equal for W (gate width) and L (gate length) of the PMOS M1, M2, M3 and NMOS M4, M5, and for example, W/L=20/1. Further, it is assumed that a transistor size ratio of the NMOS M7 and a size ratio of the NMOS M10 are also W/L=20, for example.

A transistor size ratio of the PMOS M8 is assumed to be, for example, W/L=20/2, and a transistor size ratio of the PMOS M9 is assumed to be larger than the size ratio of the PMOS M8, for example, W/L=100/2. A size ratio of the NMOS M6 is assumed to be 10/1, for example.

A voltage VCC is applied to sources of the PMOS M1, M2, and M3, and gates of the PMOS M1, M2, and M3 are mutually connected. A drain of the diode-connected PMOS M1 is connected to the constant-current circuit 1. Therefore, the PMOS M1 and the PMOS M2, M3 constitute a current mirror circuit, and since the transistor size ratios are equal for the PMOS M1, M2 and M3, constant currents of the same level as a current I flowing though the PMOS M1 are attempted to be flowed through the PMOS M2 and the PMOS M3. The voltage VCC is a constant voltage.

A drain of the PMOS M2 is connected to a drain of NMOS M4, and a drain of the PMOS M3 is connected to a detection-result output terminal.

Sources of the NMOS M4, M5 and M6 are grounded; gates of the NMOS M4, M5, M6 are mutually connected; and the NMOS M4 is diode-connected. Therefore, the PMOS M4 and the PMOS M5, M6 constitute a current mirror circuit, and the PMOS M5 ("one output") and the PMOS M6 (the other output) are outputs of the current mirror circuit. Since a drain of the NMOS M4 is connected to a drain of the PMOS M2, a constant current flowing through the NMOS M4 is the same level as a current I flowing through the PMOS M2. Therefore, the constant current I is also attempted to be passed through the NMOS M5 and M6. A drain of the NMOS M5 is connected to a source of the NMOS M7, and a drain of the NMOS M6 is connected to a gate of the NMOS M10.

The voltage VDD is applied to sources of the PMOS M8 and M9, and a gate of the diode-connected PMOS M8 is connected to a gate of the PMOS M9 ("a second transistor"). In this way, in for the MOSFETs with sources connected in common, if one gate is short-circuited to a drain as well as connected to the other gate and if a current corresponding to a current applied to one drain is applied to the other drain, this connection is defined as a current mirror connection. Also, for bipolar transistors, if one base is short-circuited to a collector as well as connected to the other base, this connection is defined as a current mirror connection. A drain of the PMOS M9 is connected to a gate of the NMOS M10 and a drain of the PMOS M6.

Also, a drain of the diode-connected NMOS M7 is connected to a drain of the PMOS M8.

A source of the NMOS M10 ("a third transistor") is grounded, and a drain of the NMOS M10 is connected to the detection-result output terminal.

The PMOS M9 and the NMOS M10 constitute an output circuit.

Threshold voltages of the PMOS M8 and the NMOS M7 are assumed to be 0.8 V, respectively, and a minimum voltage of 0.1 V is assumed to be needed between the source and drain of the NMOS M5 for operating, and flowing a current through, the NMOS M5 which is the output of the current mirror circuit.

Although in this implementation, the PMOS M3 in the current mirror connection with the PMOS M1 is provided between the voltage VCC and the detection-result output terminal, the PMOS M3 may not be provided, and the voltage VCC may be applied to the detection-result output terminal via a resistor.

===Operation of Voltage Detection Circuit===

Then, a description is made for operations of the voltage detection circuit according to the present invention.

The constant current I generated by the constant-current circuit I is always applied to the PMOS M1, PMOS M2 and NMOS M4 in the current mirror connection.

[Case of Voltage VDD>1.7 Volts]

Since a voltage VDD is higher than a summed voltage of the threshold value of the serially-connected PMOS M8 and NMOS M7 and the minimum voltage between the source and drain for operating the NMOS M5, the PMOS M8 and the NMOS M7 are turned on, and the current I starts to flow through the NMOS M5. Also, since the PMOS M8 is turned on, the PMOS M9 connected in the current mirror connection is turned on, and a current starts to flow through the PMOS M9.

The PMOS M9 attempts to flow a current 5*I which is larger than the current I flowing through the NMOS M8, corresponding to the transistor size ratio (W/L) to the NMOS M8, which is 1:5. Generally, in the MOSFETs with the same size ratio, on-resistance of the PMOS is poorer than on-resistance of the NMOS (hereinafter, the on-resistance of the PMOS is assumed to be 2.5 times poorer than the on-resistance of the NMOS). Since the size ratio of the PMOS M9 to the NMOS M6 is 100/2:10/1, the on-resistance ratio of the PMOS M9 to the NMOS M6 is 2.5/50:1/10=1:2.

Therefore, a gate voltage of the NMOS M10 is (2/3) *VDD, which is higher than the voltage VDD/2 (0.85 volts). The NMOS M10 is turned on by the gate voltage becoming higher than 0.85 volts and attempts to apply a current equal to or greater than I between the drain and source. If the current flowing through the NMOS M10 is I, since both the NMOS M10 and PMOS M3 have a transistor size ratio of 20/1, the on-resistance of the NMOS M10 is lower than the on-resistance of the PMOS M3. Therefore, the voltage of "L" is output from the detection-result output terminal.

[Case of Voltage VDD<1.7 Volts]

Since the voltage VDD is lower than a summed voltage of the threshold value of the serially-connected PMOS M8 and NMOS M7 and the minimum voltage between the source and drain for operating the NMOS M5, the PMOS M8 and the NMOS M7 are turned off. The PMOS M9 in the current mirror connection with the PMOS M8 is also turned off.

The NMOS M6 is the output of the current mirror circuit and attempts to flow the current I. On the other hand, since the PMOS M9 is turned off and a resistance value between the drain and source of the PMOS M9 is sufficiently larger than a resistance value between the drain and source of the PMOS M6, a gate voltage of the NMOS M10 is reduced, and the NMOS M10 is turned off. Therefore, since the voltage of the detection-result output terminal is increased by the current I flowing through the PMOS M3, the voltage of "H" is output from the detection-result output terminal.

Therefore, the power supply voltage VDD reduced lower than 1.7 V can be detected by the output of the detection-result output terminal changing from "L" to "H".

If it is detected that the voltage VDD becomes lower than 1.7 V, the voltage detection circuit forcibly terminates the logic operation of the logic circuit whose power supply voltage is the voltage VDD.

In the voltage detection circuit shown in FIG. 1, instead of providing NMOS M7, the drain of the PMOS M8 can be configured to be connected to the drain of the NMOS M5. In this case, the circuit detects that the voltage VDD is reduced to 0.9 V (0.8 V+0.1 V).

If two (2) NMOSs identical to the NMOS M7 are serially connected between the drain of the PMOS M8 and the drain of the NMOS M5, the circuit detects that the voltage VDD is reduced to 2.5 V (0.8×3+0.1).

In this way, by using the threshold voltages of the MOS transistors connected between the voltage VDD and the NMOS M5 which is the output of the current mirror circuit, the circuit can detect that the voltage VDD becomes a predetermined voltage (e.g., 1.7 V) without, using the voltage dividing resistor and the reference voltage.

===Another Implementation===

Figure 2:
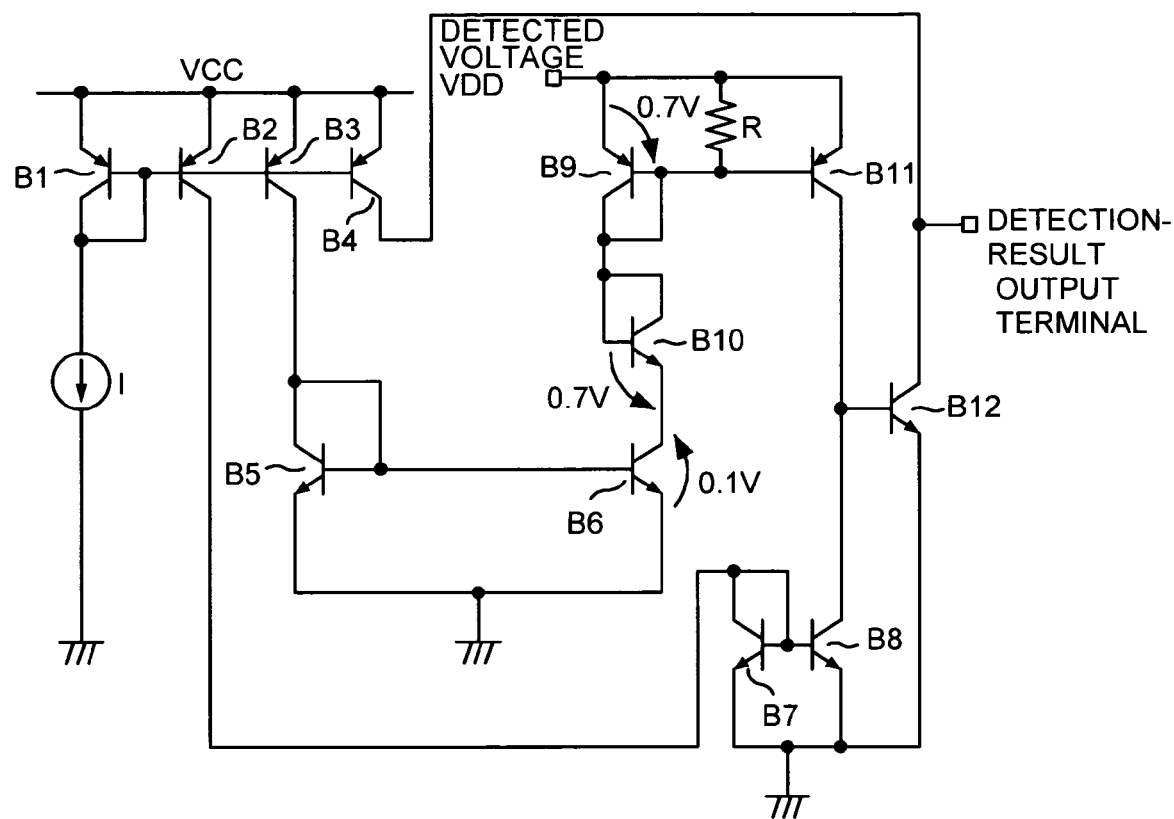
FIG. 2 is a circuit diagram of a voltage detection circuit according to another implementation of the present invention.
Figure 3:
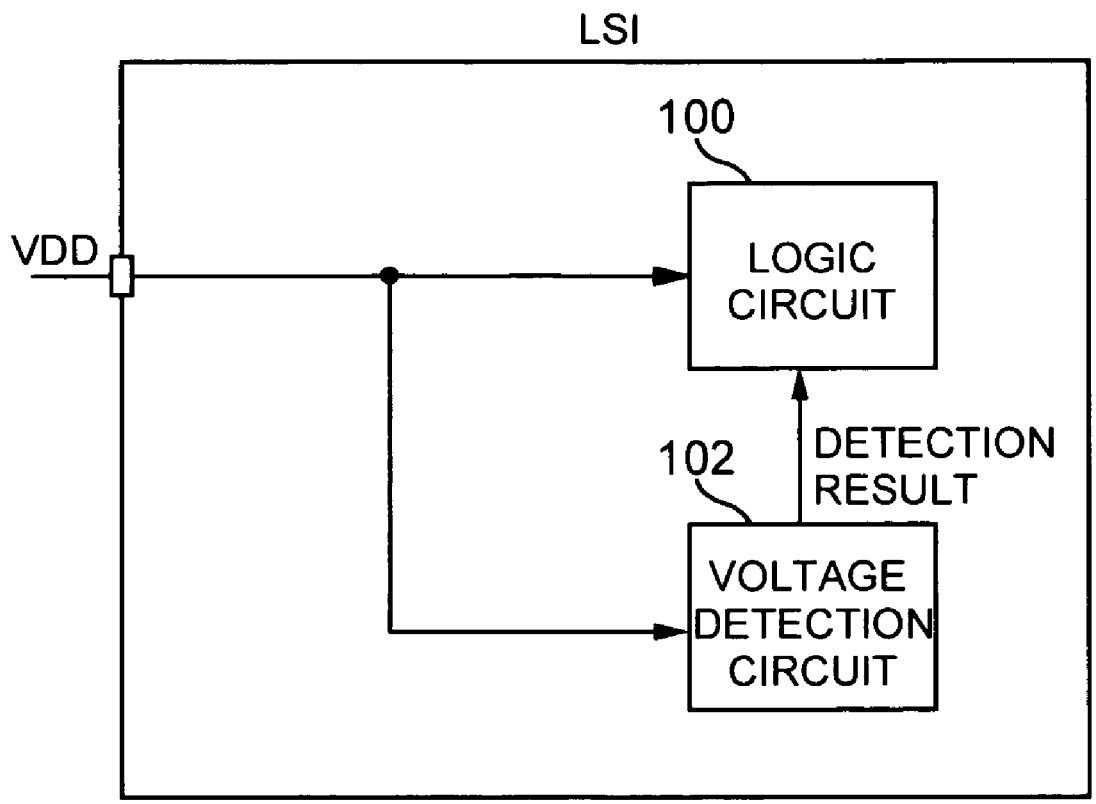
FIG. 3 is a block diagram showing a configuration for monitoring voltage reduction.
Figure 4:
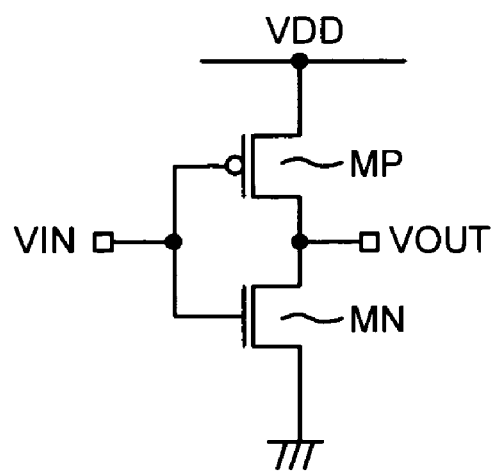
FIG. 4 is a diagram showing a configuration of a CMOS inverter circuit.
Figure 5:
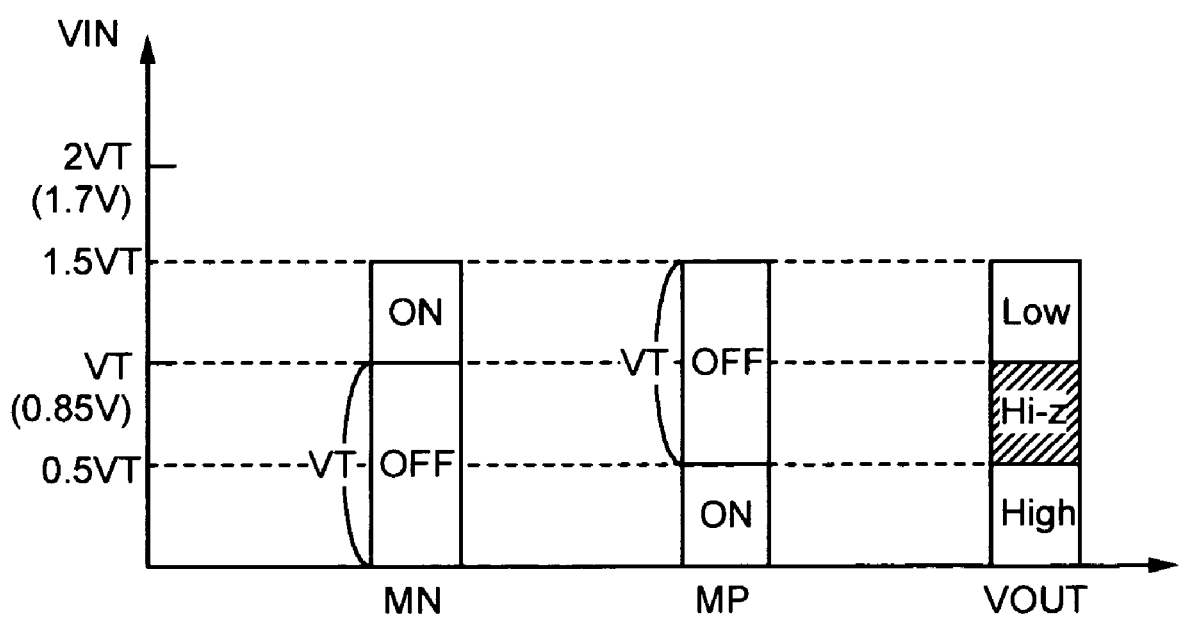
FIG. 5 is a diagram for describing operations of the CMOS inverter circuit when a voltage VDD<2*VT.
Figure 6:
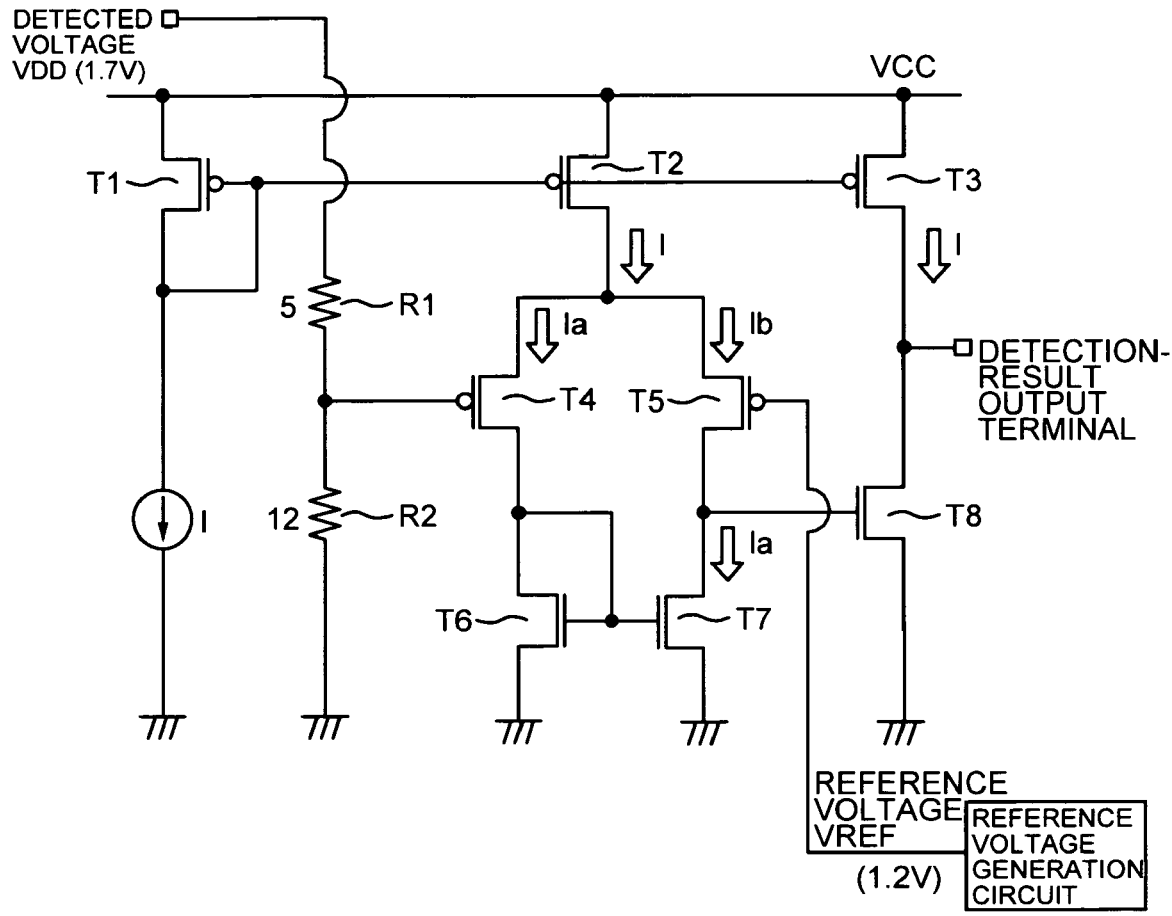
FIG. 6 is a circuit diagram showing a configuration of a conventional voltage detection circuit.

FIG. 2 is a circuit diagram showing an example of a configuration of a voltage detection circuit according to another implementation of the present invention. The voltage detection circuit shown in FIG. 2 is an example using bipolar transistors instead of MOSFET.

The voltage detection circuit shown in the figure is a voltage detection circuit for detecting that the voltage VDD becomes lower than 1.5 V and is provided with PNP-type bipolar transistors (hereinafter, referred to as PNP transistors) B1, B2, B3, B4, B9 and B11, NPN-type bipolar transistors (hereinafter, referred to as NPN transistors) B5, B6, B7, B8, B10 and B12, a constant-current circuit I and a resistor R. The voltage detection circuit shown in FIG. 2 is integrated with a logic circuit whose power supply voltage is the voltage VDD, on the same chip, for example.

It is assumed that transistor size ratios are equal for the PNP transistors B1, B2, B3 and B4. Also, it is assumed that transistor size ratios of the NPN transistors B5 and B6 are equal and the transistor size ratios of B7 and B8 are equal. Further, it is assumed that a transistor size ratio of the PNP transistor B11 is larger than a transistor size ratio of the NPN transistor 9 (e.g., a size ratio of the NPN transistor to the NPN transistor 11 is 1:5).

The voltage VCC is applied to emitters of the PNP transistors B1, B2, B3 and B4, and bases of the PNP transistors B1, B2, B3 and B4 are mutually connected. Also, a collector of the diode-connected PNP transistor B1 is connected to the constant-current circuit I. Therefore, the PNP transistors B1, B2, B3 and B4 constitute a current mirror circuit. Since the transistor size ratios are equal for the PNP transistors B1, B2, B3 and B4, the PNP transistors B2, B3 and B4 also attempt to flow constant currents of the same level as a current I flowing though the PNP transistors B1. The voltage VCC is a constant voltage.

A collector of the PNP transistor B2 is connected to a collector of the NPN transistor B7, and a collector of the PNP transistor B3 is connected to a collector of the NPN transistor B5. A collector of the PNP transistor B4 is connected to a detection-result output terminal.

Emitters of the NPN transistors B5 and B6 are grounded, and a base of the diode-connected NPN transistor B5 is connected to a base of the NPN transistor B6. Therefore, the NPN transistors B5 and B6 are connected in the current mirror connection. Since a collector of the NPN transistor B5 is connected to a collector of the PNP transistor B3, a constant current flowing through the NPN transistors B5 is the same level as the current I flowing through the PNP transistor B3.

Also, emitters of the NPN transistors B7 and B8 are grounded, and a base of the diode-connected NPN transistor B7 is connected to a base of the NPN transistor B8. Therefore, the NPN transistors B5 and B6 are connected in the current mirror connection. Since a collector of the NPN transistor B7 is connected to a collector of the PNP transistor B2, a constant current flowing through the NPN transistors B7 is the same level as the current I flowing through the PNP transistor B2.

The voltage VDD is applied to emitters of the PNP transistor B9 and B11. A base of the diode-connected PNP transistor B9 is connected to a base of the PNP transistor B11. Therefore, the PNP transistors 8 and M9 are connected in the current mirror connection. A collector of the PNP transistor B9 is connected to a collector of the NPN transistor B10, and a collector of the PNP transistor B11 is connected to a collector of the NPN transistor B8.

The resistor R is connected between the emitter and base of the PNP transistor B9.

The NPN transistor B10 is diode-connected. An emitter of the NPN transistor B10 is connected to a collector of the NPN transistor B6.

For the NPN transistor B12, a base is connected to a collector of the NPN transistor B8 and an emitter is grounded. A collector of the NPN transistor B12 is connected to the detection-result output terminal.

A voltage VBE between the base and emitter is assumed to be 0.7 V for the PNP transistor B9 and the NPN transistor B10, and a minimum voltage of 0.1 V is assumed to be needed between the emitter and collector of the NPN transistor B6 for operating, and flowing a current through, the NPN transistor B6 which is the output of the current mirror circuit. The resistance value of the resistor R is assumed to be a value larger than (voltage VBE between base and emitter of PNP transistor B9)/current I.

Then, a description is made for operations of the voltage detection circuit according to another implementation of the present invention.

The constant current I generated by the constant-current circuit I is always applied to the PNP transistors B1, B2, B4 and the NPN transistors B5, B7 which constitute the current mirror circuit.

[Case of Voltage VDD>1.5 Volts]

Since a voltage VDD is higher than a summed voltage (1.5 V) of the voltage VBE between the base and emitter of the serially-connected PNP transistor B9 and NPN transistor B10 and the minimum voltage between the emitter and collector for operating the NPN transistor B6, the PNP transistor B9 and the NPN transistor B10 is turned on, and the current I starts to flow through the NPN transistor B6. Also, since the PNP transistor B9 is turned on, the PNP transistor B11 connected in the current mirror connection is turned on, and a current starts to flow through the PNP transistor B11.

The PNP transistor B11 attempts to flow a current (5*I) which is larger than the current I flowing through the PNP transistor B9, corresponding to the transistor size ratio to the PNP transistor B9 connected in the current mirror connection, which is 1:5. Therefore, a base current of the NPN transistor B12 becomes 4*I and thereby, a collector potential is sufficiently reduced and the NPN transistor B12 is saturated. Therefore, the voltage of "L" is output from the detection-result output terminal.

[Case of Voltage VDD<1.5 Volts]

Since a voltage VDD is lower than a summed voltage (1.5 V) of the voltage VBE between the base and emitter of the serially-connected PNP transistor B9 and NPN transistor B10 and the minimum voltage between the emitter and collector for operating the NPN transistor B6, the PNP transistor B9 and the NPN transistor B10 is turned off. The PNP transistor B11 in the current mirror connection with the PNP transistor B9 is also turned off.

The NPN transistor B8 is the output of the current mirror circuit and attempts to flow the current I. However, since the PNP transistor B11 is turned off and a resistance value between the collector and emitter of the PNP transistor B11 is sufficiently larger than a resistance value between the collector and emitter of the NPN transistor B8, a current does not supplied to the base of the NPN transistor B12, and the NPN transistor B12 is turned off. Therefore, since the voltage of the detection-result output terminal is increased by the current I flowing through the PNP transistor B4, the voltage of "H" is output from the detection-result output terminal.

Because of the resistor R, when the voltage VDD is lower than 1.5V (e.g., 1V), a current I smaller than the current I flows through the NPN transistor B11 as a base current, and thereby a collector current of i*hFE (hFE is a current amplification factor of the NPN transistor 11) flows through the collector of the NPN transistor B11, which is prevented from becoming larger than the collector current of the PNP transistor B8.

Therefore, the power supply voltage VDD reduced lower than 1.5 V can be detected by the output of the detection-result output terminal changing from "L" to "H".

As described above using the example of using the MOSFET and the bipolar transistors, the voltage detection circuit of the present inventions does not need the reference voltage VREF obtained from the reference voltage generation circuit provided outside as well as the voltage dividing resistors R1 and R2 dividing the detected voltage VDD. Since the reference voltage VREF is not necessary, the chip area can be reduces as compared to the conventional voltage detection circuit in the case of integrating the reference voltage generation circuit onto the same chip. Also, since currents are not applied to the voltage dividing resistors R1 and R2, power consumption can be lowered.

When using the MOSFET in the voltage detection circuit as shown in FIG. 1, if the voltage VDD is 2*VT or higher, the PMOS M9 is turned on and, because the on-resistance thereof is lower than the on-resistance of the NMOS M6, the gate voltage of the NMOS M10 becomes VDD/2 (0.85 volts) or higher. Therefore, the NMOS M10 is turned on and the voltage of "L" is output from the detection-result output terminal. On the other hand, if the voltage VDD is lower than 2*VT, the PMOS M9 is turned off and, because the gate voltage of the NMOS M10 is lowered, the voltage of "H" is output from the detection-result output terminal. In this way, the configuration with the MOSFET can easily detect that the voltage VDD becomes lower than 2*VT. Also, the voltage detection circuit of the present invention can use the bipolar transistors as shown in FIG. 2. In this case, the voltage VDD becoming lower than 2*VBE can be also detected depending on turning on or off of the NPN transistor B12, as is the case with the MOSFET.

Also, by serially connecting n (n≧0) NMOSs configured identically to the NMOS M7 between the PMOS M8 and NMOS M5, a (n+1)*VT detection circuit can be configured. Further, if the bipolar transistors are used, a (n+1)*VBE detection circuit can be configured by serially connecting n (n≧0) NPN transistors configured identically to the NPN transistor B10 between the PNP transistor B9 and NPN transistor B6.

The voltage detection circuit of the present invention can be preferably used for detection of reduction of the voltage VDD used as a power source of a CMOS inverter circuit. If the voltage detection circuit detects that the voltage VDD becomes lower than 2*(1.7V), the voltage detection circuit can shut down the output of the CMOS inverter circuit to prevent the voltage VOUT output from the CMOS inverter circuit from becoming "Hi-z".

Further, if the logic circuit and the voltage detection circuit are integrated onto the same chip, a temperature characteristic of VT of the MOSFET constituting the logic circuit can be made equal to a temperature characteristic of the voltage detection circuit.

While the present invention has been specifically described based on the implementations thereof, the present invention is not intended to be limited thereto and can be diversely changed or modified within the scope of the present invention without departing from the gist thereof.

The invention claimed is:

1. A voltage detection circuit, comprising:
   a constant-current circuit;
   a current mirror circuit operated by the constant-current circuit, the current mirror circuit having a first output and a second output;
   at least one diode-connected first transistor disposed between the first output of the current mirror circuit and a detected voltage; and
   an output circuit outputting one logic voltage in response to a turn-on of the at least one diode-connected first transistor when the detected voltage is a predetermined voltage or higher, and outputting the other logic voltage in response to a turn-off of the at least one diode-connected first transistor when the detected voltage is lower than the predetermined voltage, the output circuit comprising:
      a second transistor connected to the at least one diode-connected first transistor in a current mirror configuration, and
      a third transistor, a control electrode of which being connected to a junction between the second transistor and the second output of the current mirror circuit, the output circuit outputting the one logic voltage or the other logic voltage based on a turn-on or turn-off of the third transistor.

2. The voltage detection circuit of claim 1, wherein when the second transistor is turned on, the output current of the second transistor is larger than a cuffent applied to the second output of the current mirror circuit.

3. The voltage detection circuit of claim 1, wherein the at least one diode-connected first transistor comprises:
   a P-type MOSFET with a short circuit between a gate and drain, the P-type MOSFET connected to the second transistor in a current mirror configuration, and
   an N-type MOSFET with a short circuit between a gate and drain, the N-type MOSFET serially connected between the P-type MOSFET and the first output of the current mirror circuit.

4. The voltage detection circuit of claim 2, wherein the at least one diode-connected first transistor comprises:
   a P-type MOSFET with a short circuit between a gate and drain, the P-type MOSFET connected to the second transistor in a current mirror configuration, and
   an N-type MOSFET with a short circuit between a gate and drain, the N-type MOSFET serially connected between the P-type MOSFET and the first output of the current mirror circuit.

* * * * *

UNITED STATES PATENT AND TRADEMARK OFFICE
CERTIFICATE OF CORRECTION

PATENT NO. : 7,224,192 B2  Page 1 of 1
APPLICATION NO. : 11/251263
DATED : May 29, 2007
INVENTOR(S) : Fukushi et al.

It is certified that error appears in the above-identified patent and that said Letters Patent is hereby corrected as shown below:

Column 9 line 57, replace "2*VT" with --2*VT (1.7V)--.

Column 10 line 39, replace "cuffent" with --current--.

Signed and Sealed this

Third Day of July, 2007

JON W. DUDAS
*Director of the United States Patent and Trademark Office*